United States Patent
Haag et al.

(10) Patent No.: US 9,761,843 B2
(45) Date of Patent: Sep. 12, 2017

(54) EMISSIVE DISPLAY WITH HYBRID POLARIZER

(71) Applicant: 3M INNOVATIVE PROPERTIES COMPANY, St. Paul, MN (US)

(72) Inventors: Adam D. Haag, Woodbury, MN (US); Ghidewon Arefe, Coon Rapids, MN (US); Kenneth A. Epstein, St. Paul, MN (US); Nathaniel K. Naismith, St. Paul, MN (US); Seong Taek Lee, Woodbury, MN (US); Sergey Lamansky, Redmond, WA (US); William A. Tolbert, Woodbury, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 0 days.

(21) Appl. No.: 14/648,518

(22) PCT Filed: Nov. 21, 2013

(86) PCT No.: PCT/US2013/071282
§ 371 (c)(1),
(2) Date: May 29, 2015

(87) PCT Pub. No.: WO2014/085197
PCT Pub. Date: Jun. 5, 2014

(65) Prior Publication Data
US 2015/0325813 A1    Nov. 12, 2015

Related U.S. Application Data (60) Provisional application No. 61/731,714, filed on Nov. 30, 2012.

(51) Int. Cl.
*H01L 51/52* (2006.01)
*H01L 27/32* (2006.01)
*G02B 27/28* (2006.01)

(52) U.S. Cl.
CPC ........ *H01L 51/5281* (2013.01); *G02B 27/281* (2013.01); *H01L 27/3244* (2013.01);
(Continued)

(58) Field of Classification Search
CPC combination set(s) only.
See application file for complete search history.

(56) References Cited

U.S. PATENT DOCUMENTS

| | | |
|---|---|---|
| 5,751,388 A | 5/1998 | Larson |
| 5,793,456 A | 8/1998 | Broer |

(Continued)

FOREIGN PATENT DOCUMENTS

| | | |
|---|---|---|
| KR | 10-2012-0127897 | 11/2012 |
| WO | WO 2013-130247 | 9/2013 |

OTHER PUBLICATIONS

International Search Report for PCT International Application No. PCT/US2013/071282, mailed on Mar. 10, 2014, 4 pgs.

*Primary Examiner* — Kyoung Lee
*Assistant Examiner* — Ratisha Mehta
(74) *Attorney, Agent, or Firm* — Lisa P. Fulton (57) ABSTRACT

An emissive display comprising an OLED, a first birefringent reflective polarizer, a second birefringent reflective polarizer optically between the OLED and the first birefringent reflective polarizer, a first linear absorbing polarizer having a contrast ratio of less than 100:1 optically between the first birefringent reflective polarizer and the second birefringent reflective polarizer, a second linear absorbing polarizer having a contrast ratio of less than 100:1, where the first birefringent reflective polarizer is optically between the
(Continued)

second linear absorbing polarizer and the first linear absorbing polarizer, and a structured optical film optically between the OLED and the second birefringent reflective polarizer.

20 Claims, 1 Drawing Sheet

(52) U.S. Cl.
CPC ...... *H01L 51/5271* (2013.01); *H01L 51/5275* (2013.01); *H01L 51/5268* (2013.01)

(56) References Cited

U.S. PATENT DOCUMENTS

| | | | |
|---|---|---|---|
| 5,808,794 A | 9/1998 | Weber | |
| 5,825,543 A | 10/1998 | Ouderkirk | |
| 5,867,316 A | 2/1999 | Carlson | |
| 5,882,774 A | 3/1999 | Jonza | |
| 6,122,103 A | 9/2000 | Perkins | |
| 6,486,997 B1 | 11/2002 | Bruzzone | |
| 6,498,683 B2 | 12/2002 | Condo | |
| 7,140,812 B2 | 11/2006 | Bryan | |
| 7,468,211 B2 | 12/2008 | McCormick | |
| 7,638,796 B2 | 12/2009 | Kwak | |
| 7,826,009 B2 | 11/2010 | Weber | |
| 8,469,575 B2 | 6/2013 | Weber | |
| 2002/0159019 A1 | 10/2002 | Pokorny | |
| 2003/0067760 A1 | 4/2003 | Jagt | |
| 2005/0123229 A1 | 6/2005 | Huck | |
| 2005/0194896 A1* | 9/2005 | Sugita | B82Y 20/00 313/506 |
| 2007/0020451 A1 | 1/2007 | Padiyath | |
| 2008/0043329 A1 | 2/2008 | Jagt | |
| 2008/0151371 A1* | 6/2008 | Weber | G02B 27/281 359/487.02 |
| 2008/0197518 A1 | 8/2008 | Aylward | |
| 2010/0128351 A1 | 5/2010 | Epstein | |
| 2010/0177265 A1 | 7/2010 | Jung | |
| 2010/0320494 A1 | 12/2010 | Kim | |
| 2012/0098421 A1 | 4/2012 | Thompson | |
| 2012/0234460 A1 | 9/2012 | Zhang | |

\* cited by examiner

EMISSIVE DISPLAY WITH HYBRID POLARIZER

FIELD

The disclosure relates to emissive displays and, in particular, to emissive displays that includes a hybrid polarizer.

BACKGROUND

Organic Light Emitting Diode (OLED) devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

Emissive displays such as OLEDs commonly use antireflection films such as circular polarizers to reduce reflection from ambient light caused by the metallic layers of the OLED. A circular polarizer comprised of a linear absorbing polarizer and a ¼ wave film extinguishes a large amount of ambient light incident on the display. This circular polarizer has the disadvantages of absorbing 50% or more of the emitted light from the OLED and also is expensive to produce due the difficulty of applying the ¼ wave film to the linear polarizer since the pass axis of the linear polarizer and the fast or slow axis of the ¼ wave (QW) film must be aligned 45 degrees relative to each other.

The display contrast is defined as the ratio (White−Black)/Black, where White is the brightest on-state and Black is the darkest off-state. In a darkened room, the contrast is limited by the intrinsic Black and White luminance values of the display device. In normal use the ambient light level and the display reflectance add to the intrinsic luminance levels. An ideal circular polarizer (CP) cuts the White state luminance by 50% and it reduces the ambient reflectance to that of the first surface of the polarizer. Because a practical QW element is exact at only one wavelength and only one view angle, hence there is a baseline reflectance.

In a bright ambient environment, such as daylight, the best commercial CP may be insufficient to maintain the required contrast, whereas, in a typical home or office environment the required contrast may be achieved without a high performance CP. The cost of the CP film stack must adjust with the performance value demanded in the intended use.

The display brightness is a key attribute that bears a cost in the expense of electronic drive capacity and its associated bulk as well as the emitter lifetime. In addition, the display power efficiency is an important consumer regulatory counterbalance to display brightness. The CP antireflection stack cuts the brightness and power efficiency by more than half. An anti-reflection component that also enhances brightness adds value.

The CP implementation is complicated by the prescribed 45-degree alignment of the QW and linear polarizer films, which often requires piece to piece lamination rather than roll to roll lamination. An anti-reflection component that enables roll to roll assembly reduces cost.

BRIEF SUMMARY

The disclosure relates to emissive displays and, in particular, to emissive displays that include hybrid polarizers.

In many embodiments an emissive display includes an OLED, a first and second birefringent reflective polarizer, a first and second linear absorbing polarizer having a contrast ratio of less than 100:1 and a structured optical film. The second birefringent reflective polarizer is optically between the OLED and the first birefringent reflective polarizer. The first linear absorbing polarizer is optically between the first birefringent reflective polarizer and the second birefringent reflective polarizer, and the first birefringent reflective polarizer is optically between the second linear absorbing polarizer and the first linear absorbing polarizer. The structured optical film is optically between the OLED and the second birefringent reflective polarizer. A ¼ wave film can be optionally disposed between the reflective polarizer and the structured optical film.

In further embodiments an emissive display includes an OLED, a first and second birefringent reflective polarizer, a first and second linear absorbing polarizer having a contrast ratio of less than 10:1, a structured optical film and a quarter wave element. The second birefringent reflective polarizer is optically between the OLED and the first birefringent reflective polarizer. The first linear absorbing polarizer is optically between the first birefringent reflective polarizer and the second birefringent reflective polarizer. The first birefringent reflective polarizer is optically between the second linear absorbing polarizer and the first linear absorbing polarizer. The structured optical film is optically between the OLED and the second birefringent reflective polarizer. The quarter wave element is optically between the structured optical film and the second birefringent reflective polarizer.

In many embodiments an emissive display includes an OLED, a first and second birefringent reflective polarizer, a first and second linear absorbing polarizer having a contrast ratio of less than 100:1 and a non-polarization preserving element. The second birefringent reflective polarizer is optically between the OLED and the first birefringent reflective polarizer. The first linear absorbing polarizer is optically between the first birefringent reflective polarizer and the second birefringent reflective polarizer and the first birefringent reflective polarizer is optically between the second linear absorbing polarizer and the first linear absorbing polarizer. The non-polarization preserving element is optically between the OLED and the second birefringent reflective polarizer.

The details of one or more embodiments of the disclosure are set forth in the accompanying drawings and the description below. Other features, objects, and advantages of the disclosure will be apparent from the description and drawings, and from the claims.

BRIEF DESCRIPTION OF THE DRAWINGS

The disclosure may be more completely understood in consideration of the following detailed description of various embodiments of the disclosure in connection with the accompanying drawings, in which.

DETAILED DESCRIPTION

In the following detailed description, reference is made to the accompanying drawings that form a part hereof, and in which are shown by way of illustration several specific embodiments. It is to be understood that other embodiments are contemplated and may be made without departing from the scope or spirit of the present disclosure. The following detailed description, therefore, is not to be taken in a limiting sense.

All scientific and technical terms used herein have meanings commonly used in the art unless otherwise specified. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

As used in this specification and the appended claims, the singular forms "a," "an," and "the" encompass embodiments having plural referents, unless the content clearly dictates otherwise. As used in this specification and the appended claims, the term "or" is generally employed in its sense including "and/or" unless the content clearly dictates otherwise.

Spatially related terms, including but not limited to, "lower," "upper," "beneath," "below," "above," and "on top," if used herein, are utilized for ease of description to describe spatial relationships of an element(s) to another. Such spatially related terms encompass different orientations of the device in use or operation in addition to the particular orientations depicted in the figures and described herein. For example, if an object depicted in the figures is turned over or flipped over, portions previously described as below or beneath other elements would then be above those other elements.

As used herein, when an element, component or layer for example is described as forming a "coincident interface" with, or being "on" "connected to," "coupled with" or "in contact with" another element, component or layer, it can be directly on, directly connected to, directly coupled with, in direct contact with, or intervening elements, components or layers may be on, connected, coupled or in contact with the particular element, component or layer, for example. When an element, component or layer for example is referred to as being "directly on," "directly connected to," "directly coupled with," or "directly in contact with" another element, there are no intervening elements, components or layers for example.

As used herein, "have", "having", "include", "including", "comprise", "comprising" or the like are used in their open ended sense, and generally mean "including, but not limited to." It will be understood that the terms "consisting of" and "consisting essentially of" are subsumed in the term "comprising," and the like.

The term "OLED" refers to an organic light emitting device. OLED devices include a thin film of electroluminescent organic material sandwiched between a cathode and an anode, with one or both of these electrodes being a transparent conductor. When a voltage is applied across the device, electrons and holes are injected from their respective electrodes and recombine in the electroluminescent organic material through the intermediate formation of emissive excitons.

The phrase "non-polarization preserving element," defined here, is a bulk optic, coating, or film that depolarize, convert or alter the polarization of a portion of an incident polarized beam of light. The portion may be selected spatially, angularly, or by wavelength and may be part or the entire incident beam. Non-polarization preserving elements may include bulk optics such as Cornu or Lyot depolarizers, optical retarder films or coatings, volume scattering films or coatings, heterogeneous coatings containing form birefringent or molecularly birefringent domains such as liquid crystals, polymer liquid crystals, or other polarizable polymers, and metamaterials containing mixed orientation domains of birefringent media.

A "structured optical film" refers to a film or layer that improves light outcoupling from an OLED device and/or improves angular luminance or/and color uniformity of the OLED. The light extraction function and angular luminance/color improvement function can also be combined in one structured film. A structured optical film can include periodic, quasi-periodic or random engineered nanostructures (e.g., light extraction film, described below), and/or it can include periodic, quasi-periodic or random engineered microstructures with structured feature size of equal or higher than 1 um.

A "light extraction film" refers to a substantially transparent substrate, low index nanostructures, and a high index backfill layer forming a substantially planar surface over the nanostructures. The term "substantially planar surface" means that the backfill layer planarizes the underlying layer, although slight surface variations may be present in the substantially planar surface. When the planar surface of the backfill layer is placed against the light output surface of the OLED device the nanostructures at least partially enhance light output from the OLED device. The backfill planar surface can be placed directly against the OLED light output surface or through another layer between the planar surface and light output surface.

The terms "nanostructure" or "nanostructures" refers to structures having at least one dimension (e.g., height, length, width, or diameter) of less than 2 micrometers and more preferably less than one micrometer. Nanostructure includes, but is not necessarily limited to, particles and engineered features. The particles and engineered features can have, for example, a regular or irregular shape. Such particles are also referred to as nanoparticles. The term "nanostructured" refers to a material or layer having nanostructures.

The disclosure relates to emissive displays and, in particular, to emissive displays that includes a hybrid polarizer, among other aspects. The emissive display can include a hybrid polarizer and a structured optical film or a non-polarization preserving element. The hybrid polarizer in combination with the structured optical film provides improved optical properties for an emissive display. While the present disclosure is not so limited, an appreciation of various aspects of the disclosure will be gained through a discussion of the examples provided below.

The function of the two linear polarizers in an LCD display is different from the single linear polarizer in the antireflection stack of the OLED display. As such, a linear polarizer specified for an OLED display may be significantly different from linear polarizers selected for a transmissive LCD.

Referring to an LCD display, the functional light path is unidirectional and the intrinsic or dark room contrast ratio is limited by the contrast ratio of the front and rear polarizers, which is typically greater than 5000:1. The liquid crystal layer is a switchable retarder that modulates the LCD transmission through the crossed polarizers.

The functional light path through the antireflection stack in an OLED display is bi-directional. Ambient light passes through the linear polarizer, becomes polarized, then converts or depolarizes as it traverses the non-polarization preserving element and reflects from the OLED. A portion of the light is then absorbed as it returns through the linear polarizer. The dark room contrast ratio does not depend upon the polarizer contrast ratio, but the room light contrast ratio does, up to a point.

The ambient light reflectance from the OLED display is comprised of the polarizer front surface reflectance, the pass state leakage, and the block state leakage. The pass state leakage is the portion of the ambient light that returns to the linear polarizer in the pass state after traversing the non-polarization preserving element and reflecting from the OLED. If the antireflection stack is a high contrast ratio achromatic circular polarizer, then the front surface reflectance dominates. In embodiments that contain a reflective polarizer and a non-polarization preserving element, the pass state leakage may dominate. Such cases may admit more polarizer block state leakage without significant penalty. Hence, the polarizer contrast ratio specification may be relaxed.

For a linear polarizer contrast ratio of 10:1 the block state leakage is of the order 1% at most, since light passes twice through the polarizer. Then the block state leakage is a small addition to a front surface reflectance of 4% and a pass state leakage of 5%.

Figure 1:
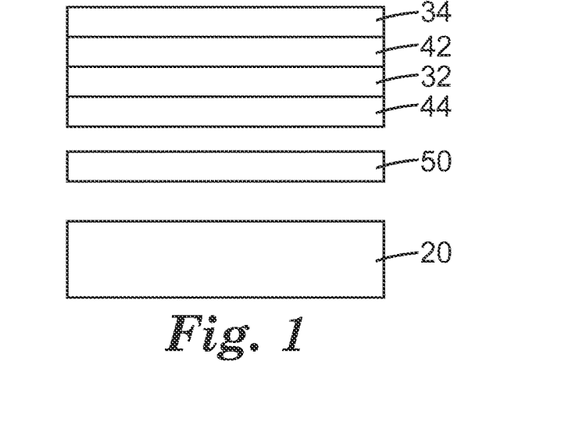
FIG. 1 is a schematic cross-sectional view of an emissive display.
Figure 2:
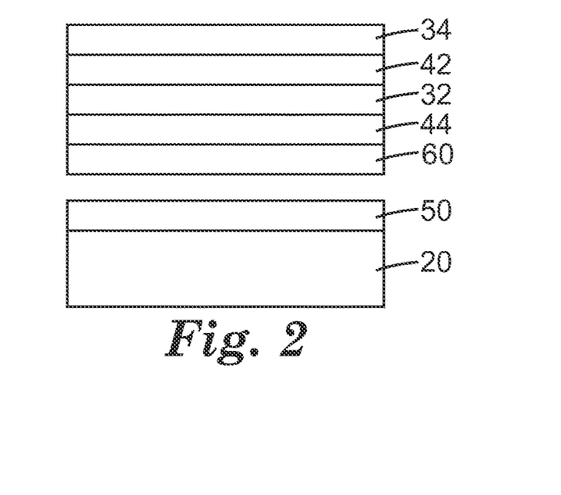
FIG. 2 is a schematic cross-sectional view of another emissive display.
Figure 3:
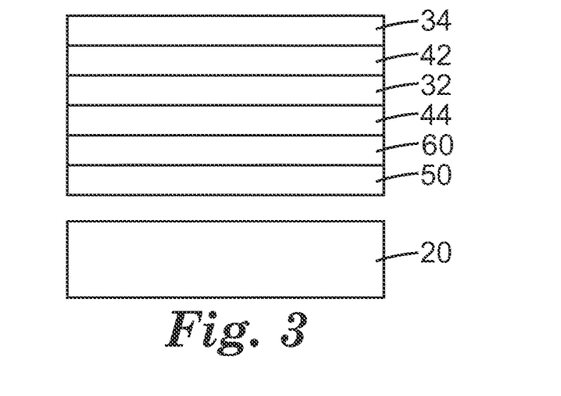
FIG. 3 is a schematic cross-sectional view of another emissive display.

FIGS. 1-3 are schematic cross-sectional views of an emissive display. The emissive display includes an OLED 20, a first reflective polarizer 42 and second reflective polarizer 44, a first linear absorbing polarizer 32 and second linear absorbing polarizer 34 and a structured optical film 50 or a non-polarization preserving element 50. In some embodiments the emissive display further includes a quarter wave element 60. In other embodiments the emissive display does not include a quarter wave element 60.

In many embodiments, the second reflective polarizer 44 is optically between the OLED 20 and the first reflective polarizer 42. The first linear absorbing polarizer 32 is optically between the first reflective polarizer 42 and the second reflective polarizer 44. The first reflective polarizer 42 is optically between the second linear absorbing polarizer 34 and the first absorbing polarizer 32. The structured optical film 50 or a non-polarization preserving element 50 is optically between the OLED 20 and the second birefringent reflective polarizer 44. In many embodiments the first reflective polarizer 42 and second reflective polarizer 44 are birefringent reflective polarizers. In many embodiments, the first linear absorbing polarizer 32 and second linear absorbing polarizer 34 are "weak" linear absorbing polarizers that have a contrast ratio of less than 100:1 or less than 10:1. The first reflective polarizer 42, second reflective polarizer 44, first linear absorbing polarizer 32 and second linear absorbing polarizer 34 can form a single composite film element and is referred to as a "hybrid" polarizer herein. While four polarizer layers are illustrated, the hybrid polarizer can have three or more layers, having at least one linear absorbing polarizer sandwiched between two reflective polarizer layers. In many embodiments, the pass axes of all the polarizer layers are substantially aligned.

The emissive display illustrated in FIG. 1 includes an OLED 20, a first reflective polarizer 42 and second reflective polarizer 44, a first linear absorbing polarizer 32 and second linear absorbing polarizer 34 and a structured optical film 50 or a non-polarization preserving element 50. The illustrated first reflective polarizer 42 and second reflective polarizer 44, a first linear absorbing polarizer 32 and second linear absorbing polarizer 34 form a single composite hybrid polarizer element and the structured optical film 50 or a non-polarization preserving element 50 may or may not be optically coupled to the OLED 20. FIG. 1 does not include a quarter wave element (see element 60 in FIG. 2).

The emissive display illustrated in FIG. 2 includes an OLED 20, a first reflective polarizer 42 and second reflective polarizer 44, a first linear absorbing polarizer 32 and second linear absorbing polarizer 34, a structured optical film 50 or a non-polarization preserving element 50 and a quarter wave element 60. The illustrated first reflective polarizer 42 and second reflective polarizer 44, a first linear absorbing polarizer 32 and second linear absorbing polarizer 34 form a single composite hybrid polarizer element along with the quarter wave element 60. The structured optical film 50 or a non-polarization preserving element 50 may or may not be optically coupled to the OLED 20.

The emissive display illustrated in FIG. 3 includes an OLED 20, a first reflective polarizer 42 and second reflective polarizer 44, a first linear absorbing polarizer 32 and second linear absorbing polarizer 34, a structured optical film 50 or a non-polarization preserving element 50 and a quarter wave element 60. The illustrated first reflective polarizer 42 and second reflective polarizer 44, a first linear absorbing polarizer 32 and second linear absorbing polarizer 34 form a single composite hybrid polarizer element along with the quarter wave element 60 and the structured optical film 50 or a non-polarization preserving element 50. The structured optical film 50 or a non-polarization preserving element 50 is not optically coupled to the OLED 20.

The OLED 20 can be any useful light emissive device. Considering the microcavity effect, OLEDs can be roughly categorized into two types, i.e., weak microcavity OLEDs and strong microcavity OLEDs. Conventional bottom emitting OLEDs are weak microcavity devices, while OLEDs with distributed Bragg reflectors or two metallic electrodes are considered as strong microcavity devices. Light emission properties, including the internal quantum efficiency ($\eta$int), external quantum efficiency, exciton lifetime, and angular dependence, are distinct in the two types of OLEDs due to Fabri-Perot resonant cavity effect and the Purcell effect. In many embodiments the OLED 20 is strong microcavity OLED. In other embodiments the OLED 20 is a weak microcavity OLED.

The linear polarizers 32, 34 can be any useful linear polarizer element. A linear polarizer transmits light with a single polarization state. The linear polarizer can be a wire grid polarizer or an absorptive polarizer. One useful type of absorptive polarizer is a dichroic polarizer. Dichroic polarizers are made, for example, by incorporating a dye into a polymer sheet that is then stretched in one direction. Dichroic polarizers can also be made by uniaxially stretching a semicrystalline polymer such as polyvinyl alcohol, then staining the polymer with an iodine complex or dichroic dye, or by coating a polymer with an oriented dichroic dye. These polarizers often use polyvinyl alcohol as the polymer matrix for the dye. Dichroic polarizers generally have a large amount of absorption of light. As described above, in many embodiments, the linear absorbing polarizers are "weak" linear absorbing polarizers that have a contrast ratio of less than 100:1 or less than 10:1 or 5:1 or less.

The reflective polarizers 42, 44 can be any useful reflective polarizer element. A reflective polarizer transmits light with a single polarization state and reflects the remaining light. In many embodiments the reflective polarizer is a birefringent reflective polarizers. A birefringent reflective polarizer includes a multilayer optical film having a first layer of a first material disposed (e.g., by coextrusion) on a second layer of a second material. One or both of the first and second materials may be birefringent. The total number of layers may be hundreds or thousands or more. In some exemplary embodiments, adjacent first and second layers may be referred to as an optical repeating unit. Reflective polarizers suitable for use in exemplary embodiments of the present disclosure are described in, for example, U.S. Pat. Nos. 5,882,774, 6,498,683, 5,808,794, which are incorporated herein by reference.

Any suitable type of reflective polarizer may be used for the reflective polarizer, e.g., multilayer optical film (MOF) reflective polarizers; diffusely reflective polarizing film (DRPF), such as continuous/disperse phase polarizers; wire grid reflective polarizers; or cholesteric reflective polarizers.

Both the MOF and continuous/disperse phase reflective polarizers rely on the difference in refractive index between at least two materials, usually polymeric materials, to selectively reflect light of one polarization state while transmitting light in an orthogonal polarization state. Some examples of MOF reflective polarizers are described in co-owned U.S. Pat. No. 5,882,774 (Jonza et al.). Commercially available examples of MOF reflective polarizers include Vikuiti™ DBEF-D2-400 and DBEF-D4-400 multilayer reflective polarizers that include diffusive surfaces, available from 3M Company.

Examples of DRPF useful in connection with the present disclosure include continuous/disperse phase reflective polarizers as described, e.g., in co-owned U.S. Pat. No. 5,825,543 (Ouderkirk et al.), and diffusely reflecting multilayer polarizers as described, e.g., in co-owned U.S. Pat. No. 5,867,316 (Carlson et al.). Other suitable types of DRPF are described in U.S. Pat. No. 5,751,388 (Larson).

Some examples of wire grid polarizers useful in connection with the present disclosure include those described, e.g., in U.S. Pat. No. 6,122,103 (Perkins et al.). Wire grid polarizers are commercially available, inter alfa, from Moxtek Inc., Orem, Utah. Some examples of cholesteric polarizers useful in connection with the present disclosure include those described, e.g., in U.S. Pat. No. 5,793,456 (Broer et al.), and U.S. Patent Publication No. 2002/0159019 (Pokorny et al.). Cholesteric polarizers are often provided along with a quarter wave retarding layer on the output side so that the light transmitted through the cholesteric polarizer is converted to linearly polarized light.

In a birefringent reflective polarizer, the refractive indices of the first layers ($n_{1x}$, $n_{1y}$, $n_{1z}$) and those of the second layers ($n_{2x}$, $n_{2y}$, $n_{2z}$) are substantially matched along one in-plane axis (y-axis) and are substantially mismatched along another in-plane axis (x-axis). The matched direction (y) forms a transmission (pass) axis or state of the polarizer, such that light polarized along that direction is preferentially transmitted, and the mismatched direction (x) forms a reflection (block) axis or state of the polarizer, such that light polarized along that direction is preferentially reflected. Generally, the larger the mismatch in refractive indices along the reflection direction and the closer the match in the transmission direction, the better the performance of the polarizer.

A multilayer optical film typically includes individual microlayers having different refractive index characteristics so that some light is reflected at interfaces between adjacent microlayers. The microlayers are sufficiently thin so that light reflected at a plurality of the interfaces undergoes constructive or destructive interference to give the multilayer optical film the desired reflective or transmissive properties. For multilayer optical films designed to reflect light at ultraviolet, visible, or near-infrared wavelengths, each microlayer generally has an optical thickness (a physical thickness multiplied by refractive index) of less than about 1 μm. However, thicker layers can also be included, such as skin layers at the outer surfaces of the multilayer optical film, or protective boundary layers (PBLs) disposed between the multilayer optical films, that separate the coherent groupings of microlayers. Such a multilayer optical film body can also include one or more thick adhesive layers to bond two or more sheets of multilayer optical film in a laminate.

In some cases, to function well for wide angle viewing of an emissive display device, a birefringent reflective polarizer maintains a high block state contrast for all angles of incidence and also maintains a high pass transmission over all angles of incidence. As it has been shown in the commonly owned U.S. Pat. No. 5,882,774, pass state transmission increases when the refractive indices of the alternating first and second layers and are matched for light polarized along the z-axis and for light polarized along the y-axis. The z-index matching also ensures that the block state transmission does not degrade at high angles of incidence. One specific useful birefringent reflective polarizer is a birefringent polymeric multi-layer polarizing film known under the trade designation "3M Advanced Polarizing Film" or "APF". U.S. Pat. No. 6,486,997, mentions the use of such a film as a PBS.

In some cases to function well for wide angle viewing of an emissive display device, the reflective polarizer has a reflectivity that generally increases with angle of incidence, and a transmission that generally decreases with angle of incidence. Such reflectivity and transmission may be for unpolarized visible light in any plane of incidence, or for light of a useable polarization state incident in a plane for which oblique light of the useable polarization state is p-polarized, or an orthogonal plane for which oblique light of the useable polarization state is s-polarized. This behavior can be desirable for some displays in order to emit more light at viewing angles more important to the display industry. This effect is called collimation. Examples of these types of films are described in U.S. Pat. No. 8,469,575.

The structured optical film 50 or a non-polarization preserving element 50 described herein can be a separate film applied to an OLED device. For example, an optical coupling layer can be used to optically couple the structured optical film or a non-polarization preserving element to a light output surface of an OLED device. The optical coupling layer can be applied to the structured optical film or a non-polarization preserving element, the OLED device, or both, and it can be implemented with an adhesive to facilitate application of the structured optical film or a non-polarization preserving element to the OLED device. As an alternative to a separate optical coupling layer, the high index backfill layer itself may be comprised of a high index adhesive, so that the optical and planarizing functions of the backfill, and the adhering function of the adhesive optical coupling layer, are performed by the same layer. Examples of optical coupling layers and processes for using them to laminate light extraction films to OLED devices are described in U.S. Patent Publication No. 2012/0234460, entitled "OLED Light Extraction Films Having Nanoparticles and Periodic Structures," and filed Mar. 17, 2011, which is incorporated herein by reference as if fully set forth.

The nanostructures for structured optical film or a non-polarization preserving element (e.g., light extraction film) can be formed integrally with the substrate or in a layer applied to the substrate. For example, the nanostructures can be formed on the substrate by applying to the substrate a low-index material and subsequently patterning the material. Nanostructures are structures having at least one dimension, such as width, less than 1 micron.

Nanostructure includes, but is not necessarily limited to, particles and engineered features. The particles and engineered features can have, for example, a regular or irregular shape. Such particles are also referred to as nanoparticles. Engineered nanostructures are not individual particles but may be composed of nanoparticles forming the engineered nanostructures where the nanoparticles are significantly smaller than the overall size of the engineered structures.

The nanostructures for a structured optical film or a non-polarization preserving element (e.g., light extraction film) can be one-dimensional (1D), meaning they are periodic in only one dimension, that is, nearest-neighbor features are spaced equally in one direction along the surface, but not along the orthogonal direction. In the case of 1D periodic nanostructures, the spacing between adjacent periodic features is less than 1 micron. One-dimensional structures include, for example, continuous or elongated prisms or ridges, or linear gratings.

The nanostructures for a structured optical film or a non-polarization preserving element (e.g., light extraction film) can also be two-dimensional (2D), meaning they are periodic in two dimensions, that is, nearest neighbor features are spaced equally in two different directions along the surface. In the case of 2D nanostructures, the spacing in both directions is less than 1 micron. Note that the spacing in the two different directions may be different. Two-dimensional structures include, for example, lenslets, pyramids, trapezoids, round or square shaped posts, or photonic crystal structures. Other examples of two-dimensional structures include curved sided cone structures as described in U.S. Pat. Application Publication No. 2010/0128351, which is incorporated herein by reference as if fully set forth.

Materials for the substrates, low index multi-periodic structures, and high index backfill layers for light extraction film are provided in the published patent applications identified above. For example, the substrate can be implemented with glass, PET, polyimides, TAC, PC, polyurethane, PVC, or flexible glass. Processes for making light extraction film are also provided in the published patent applications identified above. Optionally, the substrate can be implemented with a barrier film to protect a device incorporating the light extraction film from moisture or oxygen. Examples of barrier films are disclosed in U.S. Pat. Application Publication No. 2007/0020451 and U.S. Pat. No. 7,468,211, both of which are incorporated herein by reference as if fully set forth.

The quarter wave element 60 can be any useful quarter wave element. A quarter wave element 60 or retarder can convert the polarization direction of linearly polarized light into circularly polarized light and vice versa. In some embodiments, the quarter wave element 60 can form a single composite film with the hybrid polarizer. In some embodiments, the quarter wave element can form a single composite film with the hybrid polarizer and structured optical film.

In some embodiments the emissive displays 10 does not include a quarter wave element 60. It is surprising that when utilizing the structured optical film 50 or non-polarization preserving element 50, the quarter wave element 60 can be eliminated without degrading optical properties of the emissive display 10, as illustrated in the Examples below. Eliminating the quarter wave element 60 can simplify the manufacture and reduce the cost of the emissive display 10.

Conventional circular polarizers are used on emissive displays to reduce glare from ambient light. One disadvantage of this circular polarizer is that emitted light is reduced by 50% or more. There are some display applications where higher emitted luminance efficiency is very desirable for enabling longer lifetime of the emissive display or improving displayed visual quality. In some display applications, ambient light is lower, such as TVs in the home, and requirements for reducing ambient light glare are lessened. In some embodiments of the present disclosure, the luminance efficiency increase of the emissive display relative to one with a conventional circular polarizer may be up to 1.3, in other embodiments, the luminance efficiency increase of the emissive display relative to one with a conventional circular polarizer may be up to 2.0. In other embodiments of the present disclosure, the luminance efficiency increase of the emissive display relative to one with a conventional circular polarizer may be up to 4.0. These gains in luminance efficiency are achieved while still reducing glare caused by ambient light compared to an emissive display with no anti-reflection film.

The combination of conventional circular polarizers and certain emissive displays, such as strong microcavity OLEDs, often have a large color shift as a function of viewing angle. In some cases, this is a compromise made in order to improve axial luminance efficiency. This color shift may also be caused by the lack of achromaticity of the quarter wave element due to birefringence dispersion in a conventional circular polarizer. Some embodiments of the present disclosure provide increased luminance efficiency which can allow for emissive displays without compromised color shift with angle.

Some of the advantages of the disclosed emissive displays are further illustrated by the following examples. The particular materials, amounts and dimensions recited in this example, as well as other conditions and details, should not be construed to unduly limit the present disclosure.

EXAMPLES

All parts, percentages, ratios, etc. in the examples are by weight, unless noted otherwise. Solvents and other reagents used were obtained from Sigma-Aldrich Chemical Company; Milwaukee, Wis. unless specified differently.

Materials

| Abbreviation/Product Name | Description | Available From |
|---|---|---|
| Conventional circular polarizer | Sanritz-5618 and QWP laminated together with the optical axes of the quarter wave retarder and linear absorbing polarizer at 45 degrees relative to each other | |
| PD-325H | Dichroic dye | Mitsui Fine Chemical, Japan |
| PD-335H | Dichroic dye | Mitsui Fine Chemical, Japan |
| PD-104 | Dichroic dye | Mitsui Fine Chemical, Japan |
| PD-318H | Dichroic dye | Mitsui Fine Chemical, Japan |
| OCA 8171 | Optically clear adhesive | 3M Company, St. Paul, MN |

-continued

| Abbreviation/<br>Product Name | Description | Available From |
|---|---|---|
| 3-mercaptopropyl trimethoxysilane | Chain Transfer Agent, 95% | Alfa Aesar, Ward Hill, MA |
| IRGACURE 184 | Photoinitiator | Ciba Specialty Chemicals, Tarrytown, NY |
| MoO3 | PURATRONIC MoO3, 99.9995% metals basis | Alfa Aesar, Ward Hill, MA |
| Nagase XNR5516Z-B1 | UV curable epoxy resin | Nagase chemteX Corp., Japan |
| PHOTOMER 6210 | Aliphatic urethane diacrylate | Cognis Corporation, Cincinnati, OH |
| SOLPLUS D510 | Polyester-polyamine copolymer | Lubrizol, Cleveland, OH |
| SR238 | 1,6 hexanediol diacrylate | Sartomer Company, Exton, PA |
| SR833S | Difunctional acrylate monomer | Sartomer Company, Exton, PA |
| APF | Advanced Polarizer Film | 3M Company, St Paul, MN |
| QWP | Quarter wave retarder film available under the trade name APQW92-004-MT | American Polarizers, Inc., Reading, PA |
| Sanritz-5618 | Linear absorbing polarizer available under the trade name HLC2-5618 | Sanritz Corporation, Tokyo, Japan. |
| GN071 PETg | PETg skins | Eastman Chemical, Kingsport, TN |
| PEN pellets | Polyethylene naphthalate resin pellets | 3M Company, St Paul, MN |

Preparative Examples

Preparation of D510 Stabilized 50 nm $TiO_2$ Nanoparticle Dispersions

A $TiO_2$ nanoparticle dispersion with an approximately 52% wt of $TiO_2$ was prepared using a milling process in the presence of SOLPLUS D510 and 1-methoxy-2-propanol. The SOLPLUS D510 was added in an amount of 25% wt based on $TiO_2$ weight. The mixture was premixed using a DISPERMAT mixer (Paul N. Gardner Company, Inc., Pompano Beach, Fla.) for 10 minutes and then a NETZSCH MiniCer Mill (NETZSCH Premier Technologies, LLC., Exton, Pa.) was used with the following conditions: 4300 rpm, 0.2 mm YTZ milling media, and 250 ml/min flow rate. After 1 hour of milling, a white paste-like $TiO_2$ dispersion in 1-methoxy-2-propanol was obtained. The particle size was determined to be 50 nm (Z-average size) using a Malvern Instruments ZETASIZER Nano ZS (Malvern Instruments Inc, Westborough, Mass.).

Preparation of High Index Backfill Solution (HI-BF):

20 g of D510 stabilized 50 nm $TiO_2$ solution, 2.6 g of SR833S, 0.06 g of IRGACURE 184, 25.6 g of 1-methoxy-2-propanol, 38.4 g of 2-butanone were mixed together to form a homogenous high index backfill solution.

Fabrication of Nanostructured Film with 400 nm Pitch

A 400 nm "sawtooth" grating film was fabricated by first making a multi-tipped diamond tool as described in U.S. Pat. No. 7,140,812 (using a synthetic single crystal diamond, Sumitomo Diamond, Japan).

The diamond tool was then used to make a copper micro-replication roll which was then used to make 400 nm 1D structures on a PET film in a continuous cast and cure process utilizing a polymerizable resin made by mixing 0.5% (2,4,6 trimethyl benzoyl) diphenyl phosphine oxide into a 75:25 blend of PHOTOMER 6210 and SR238.

HI-BF solution was coated onto the 400 nm pitch 1D structured film using a roll to roll coating process with a web speed of 4.5 m/min (15 ft/min) and a dispersion delivery rate of 5.1 cc/min. The coating was dried in air at room temperature, then subsequently further dried at 82° C. (180° F.) and then cured using a Fusion UV-Systems Inc. LightHammer 6 UV (Gaithersburg, Md.) processor equipped with an H-bulb, operating under nitrogen atmosphere at 75% lamp power at a line speed of 4.5 m/min (15 ft/min).

Example

Top Emissive (TE) OLED test coupons were built using standard thermal deposition in a vacuum system at base pressure of about $10^{-6}$ Torr. A substrate was fabricated on polished float glass with a 0.5 µm thick photoresist coating and with 80 nm ITO coatings patterned to produce four 5×5 mm pixels in a square arrangement. A pixel defining layer (PDL) was applied to reduce the square size to 4×4 mm and provide clearly defined pixel edges. The following structure was built: Substrate with PDL/1 nm Cr/100 nm Ag/10 nm ITO bottom electrode (cathode)/20 nm EIL/25 nm ETL/30 nm EML/10 nm HTL2/165 nm HTL1/100 nm HIL/80 nm ITO top electrode (anode)/200 nm MoO3 capping layer (CPL) where HIL, HTL, EML and ETL stand, respectively, for hole-injection, hole-transport, emissive and electron-transport layers. The top electrode was 80 nm ITO patterned via shadow masks to align with the substrate layer.

For some samples, following device fabrication and prior to encapsulation, 400 nm pitch 1D-symmetric extractor backfilled with a high refractive index material described under "Fabrication of Nanostructured Film with 400 nm Pitch" was applied onto two pixels out of four on each test coupon, using an optical coupling layer prepared as described in Example 7 of U.S. Provisional application Ser. No. 61/604,169, except that in the synthesis of Polymer-II, 2.0 g of 3-mercaptopropyl trimethoxysilane was used instead of 3.7 g. The optical coupling layer had a refractive index of about 1.7. The extractor lamination was conducted under inert ($N_2$) atmosphere and was followed by protecting under a glass lid attached by applying Nagase XNR5516Z-B1 UV-curable epoxy around the perimeter of the lid and cured with a UV-A light source at 16 Joules/$cm^2$ for 400 seconds.

A weak dichroic polarizer layer was formed using the following process. PEN pellets were fed into a twin screw extruder at a rate of 22.7 kg/hr (50.1 pounds per hour (pph)). Dichroic dyes purchased from Mitsui Chemical were also fed into the twin screw extruder at the following rates: PD-104: 45 g/hr (0.10 pph), PD-325H: 59 g/hr (0.13 pph), PD-335H: 32 g/hr (0.07 pph), and PD-318H: 77 g/hr (0.17 pph). This mixture was fed along with GN071 PETg skins at a rate of 22.7 kg/hr (50 pph) on each side through a 41 cm (16 inch) die to form a cast sheet with a speed of 6.1 m/min (20 feet per minute). The cast sheet was stretched in a tenter at a ratio of 5.6:1 at a temperature of 143° C. (290° F.) with a speed of 6.1 m/min (20 feet per minute).

An integrated polarizer was constructed by laminating the following stack together using an optically clear adhesive OCA 8171 between layers: a weak dichroic polarizer layer, APF, a second weak dichroic polarizer layer, and a second APF layer. Samples were prepared with the integrated polarizer laminated with OCA to a quarter wave plate (QWP) with the APF side of the integrated polarizer adjacent to the QWP. Two layers each of APF and weak dichroic polarizer layers were used. The following table provides transmission and contrast properties of the polarizer films.

| Sample Name | Avg pass T % 450-650 nm | Avg block T % 450-650 nm | Contrast |
| --- | --- | --- | --- |
| Sanritz-5618 | 83.8 | 0.007 | 12383.6 |
| Weak dichroic polarizer layer | 80.5 | 15.9 | 5.1 |
| Integrated polarizer | 61.4 | 0.085 | 724.2 |

The structures indicated in the table below were made and tested with the TE OLED test coupons. For the sample with a linear polarizer and a reflective polarizer, the pass axes of the linear and reflective polarizers were aligned. When multiple layers were used in the polarizer stack, the layers were laminated together using OCA 8171. The polarizer stacks were positioned with the first listed item facing the OLED. Luminance was measured as part of luminance-current-voltage (LIV) measurements using a PR650 camera (Photo Research, Inc., Chatsworth, Calif.). Reflectivity was measured using an AUTRONIC Conoscope (AUTRONIC-MELCHERS GmbH, Karlsruhe, Germany) in the diffuse light reflectance mode. The reflectivity and luminance reported in the table below are normalized to a value of unity for the sample using a conventional circular polarizer.

| Polarizer Stack | Extractor | Reflectivity | Luminance |
| --- | --- | --- | --- |
| None | None | 20.35 | 2.21 |
| Conventional circular polarizer | None | 1.00 | 1.00 |
| QWP + APF + Sanritz-5618 | None | 6.92 | 1.55 |
| QWP + Integrated Polarizer | None | 6.41 | 1.33 |
| QWP + Integrated Polarizer | 1-D structure with 400 nm pitch | 5.53 | 3.01 |

Thus, embodiments of EMISSIVE DISPLAY WITH HYBRID POLARIZER are disclosed. One skilled in the art will appreciate that the compositions described herein can be practiced with embodiments other than those disclosed. The disclosed embodiments are presented for purposes of illustration and not limitation.

What is claimed is:

1. An emissive display comprising:
an OLED;
a first birefringent reflective polarizer;
a second birefringent reflective polarizer optically between the OLED and the first birefringent reflective polarizer;
a first linear absorbing polarizer having a contrast ratio of less than 100:1 optically between the first birefringent reflective polarizer and the second birefringent reflective polarizer;
a second linear absorbing polarizer having a contrast ratio of less than 100:1, where the first birefringent reflective polarizer is optically between the second linear absorbing polarizer and the first linear absorbing polarizer; and
a structured optical film optically between the OLED and the second birefringent reflective polarizer.

2. The emissive display of claim 1, wherein the first linear absorbing polarizer has a contrast ratio of less than 10:1 and the second linear absorbing polarizer has a contrast ratio of less than 10:1.

3. The emissive display of claim 1, wherein a pass axis of each of the first birefringent reflective polarizer, second birefringent reflective polarizer, first linear absorbing polarizer and second linear absorbing polarizer are substantially aligned.

4. The emissive display of claim 1, wherein the structured optical film comprises nanostructures.

5. The emissive display of claim 4, wherein the structured optical film comprises one dimensional nanostructures.

6. The emissive display of claim 4, wherein the structured optical film comprises two dimensional nanostructures.

7. The emissive display of claim 1, further comprising a quarter wave element optically between the structured optical film and the second birefringent reflective polarizer.

8. The emissive display of claim 1, wherein the first birefringent reflective polarizer, second birefringent reflective polarizer, first linear absorbing polarizer, second linear absorbing polarizer and structured optical film form a composite film.

9. The emissive display of claim 7, wherein the first birefringent reflective polarizer, second birefringent reflective polarizer, first linear absorbing polarizer, second linear absorbing polarizer and quarter wave element form a composite film.

10. The emissive display of claim 7, wherein the first birefringent reflective polarizer, second birefringent reflective polarizer, first linear absorbing polarizer, second linear absorbing polarizer, quarter wave element and structured optical film form a composite film.

11. An emissive display comprising:
an OLED;
a first birefringent reflective polarizer;
a second birefringent reflective polarizer optically between the OLED and the first birefringent reflective polarizer;
a first linear absorbing polarizer having a contrast ratio of less than 10:1 optically between the first birefringent reflective polarizer and the second birefringent reflective polarizer;
a second linear absorbing polarizer having a contrast ratio of less than 10:1, where the first birefringent reflective polarizer is optically between the second linear absorbing polarizer and the first linear absorbing polarizer;
a structured optical film optically between the OLED and the second birefringent reflective polarizer; and
a quarter wave element optically between the structured optical film and the second birefringent reflective polarizer.

12. The emissive display of claim 11, wherein a pass axis of each of the first birefringent reflective polarizer, second birefringent reflective polarizer, first linear absorbing polarizer and second linear absorbing polarizer are substantially aligned.

13. The emissive display of claim 11, wherein the first birefringent reflective polarizer, second birefringent reflective polarizer, first linear absorbing polarizer, second linear absorbing polarizer and quarter wave element form a composite film.

14. The emissive display of claim 11, wherein the first birefringent reflective polarizer, second birefringent reflective polarizer, first linear absorbing polarizer, second linear absorbing polarizer, quarter wave element and structured optical film form a composite film.

15. The emissive display of claim 11, wherein the structured optical film comprises nanostructures.

16. The emissive display of claim 15, wherein the structured optical film comprises one dimensional nanostructures.

17. The emissive display of claim 15, wherein the structured optical film comprises two dimensional nanostructures.

18. An emissive display comprising:
an OLED;
a first birefringent reflective polarizer;
a second birefringent reflective polarizer optically between the OLED and the first birefringent reflective polarizer;
a first linear absorbing polarizer having a contrast ratio of less than 100:1 optically between the first birefringent reflective polarizer and the second birefringent reflective polarizer;
a second linear absorbing polarizer having a contrast ratio of less than 100:1, wherein the first birefringent reflective polarizer is optically between the second linear absorbing polarizer and the first linear absorbing polarizer; and
a non-polarization preserving element optically between the OLED and the second birefringent reflective polarizer.

19. The emissive display of claim 18, wherein the first linear absorbing polarizer has a contrast ratio of less than 10:1 and the second linear absorbing polarizer has a contrast ratio of less than 10:1.

20. The emissive display of claim 18, wherein a pass axis of each of the first birefringent reflective polarizer, second birefringent reflective polarizer, first linear absorbing polarizer and second linear absorbing polarizer are substantially aligned.

* * * * *